US008963021B2

(12) United States Patent
Lin

(10) Patent No.: US 8,963,021 B2
(45) Date of Patent: Feb. 24, 2015

(54) ELECTROMAGNETIC INTERFERENCE SHIELD AND ELECTRONIC DEVICE USING THE SAME

(71) Applicant: Hon Hai Precision Industry Co., Ltd., New Taipei (TW)

(72) Inventor: Chih-Hao Lin, New Taipei (TW)

(73) Assignee: Hon Hai Precision Industry Co., Ltd., New Taipei (TW)

(*) Notice: Subject to any disclaimer, the term of this patent is extended or adjusted under 35 U.S.C. 154(b) by 0 days.

(21) Appl. No.: 13/898,480

(22) Filed: May 21, 2013

(65) Prior Publication Data

US 2014/0174814 A1    Jun. 26, 2014

(30) Foreign Application Priority Data

Dec. 25, 2012  (TW) ............................. 101149678 A

(51) Int. Cl.
*H05K 9/00* (2006.01)

(52) U.S. Cl.
CPC .................................. *H05K 9/0007* (2013.01)
USPC ........................................ 174/383; 361/818

(58) Field of Classification Search
CPC ........................... H05K 9/0032; H05K 9/0041
USPC ..................... 174/383; 361/816, 818
See application file for complete search history.

(56) References Cited

U.S. PATENT DOCUMENTS

| | | | | |
|---|---|---|---|---|
| 2003/0223213 | A1* | 12/2003 | Daoud et al. | 361/818 |
| 2004/0160743 | A1* | 8/2004 | Wu | 361/719 |
| 2006/0098417 | A1* | 5/2006 | Yuan et al. | 361/816 |
| 2006/0220238 | A1* | 10/2006 | Kim | 257/731 |
| 2006/0221591 | A1* | 10/2006 | Kong | 361/818 |
| 2007/0076402 | A1* | 4/2007 | Chen et al. | 361/816 |
| 2008/0310139 | A1* | 12/2008 | English et al. | 361/818 |
| 2010/0046190 | A1* | 2/2010 | Tsunemasu | 361/816 |
| 2010/0061066 | A1* | 3/2010 | Guan et al. | 361/752 |
| 2010/0089619 | A1* | 4/2010 | Chen et al. | 174/252 |
| 2012/0031661 | A1* | 2/2012 | Tan et al. | 174/377 |
| 2012/0044663 | A1* | 2/2012 | Lu et al. | 361/818 |

FOREIGN PATENT DOCUMENTS

| | | |
|---|---|---|
| CN | 101626676 A | 1/2010 |
| TW | 200638859 A | 11/2006 |

* cited by examiner

*Primary Examiner* — Hung V Ngo
(74) *Attorney, Agent, or Firm* — Novak Druce Connolly Bove + Quigg LLP

(57) ABSTRACT

An electromagnetic interference shield includes a shell body and a magnetic material layer formed on the shell body. A number of holes are defined in the shell body. A number of through holes are defined in the magnetic material layer aligned with the holes. An electronic device having the electromagnetic interference shield is also provided.

6 Claims, 3 Drawing Sheets

ELECTROMAGNETIC INTERFERENCE SHIELD AND ELECTRONIC DEVICE USING THE SAME

BACKGROUND

1. Technical Field

The present disclosure relates to electromagnetic interference shields, and particularly to an electromagnetic interference shield and an electronic device with the electromagnetic interference shield.

2. Description of Related Art

In many electronic devices, hermetic metal outer shells are usually employed to block electromagnetic interference produced by electronic components in the electronic devices. However, the hermetic shells do not allow for heat dispersing of the electronic components. If the shells define heat dispersing holes, the shielding effect may be weakened.

Therefore, it is desirable to provide a new electromagnetic interference shield and an electronic device with the shield to resolve the above shortcomings.

BRIEF DESCRIPTION OF THE DRAWINGS

Many aspects of the present disclosure should be better understood with reference to the following drawings. The units in the drawings are not necessarily drawn to scale, the emphasis instead being placed upon clearly illustrating the principles of the present disclosure. Moreover, in the drawings, like reference numerals designate corresponding portions throughout the several views.

DETAILED DESCRIPTION

Embodiments of the present disclosure will be described with reference to the accompanying drawings.

Figure 1:
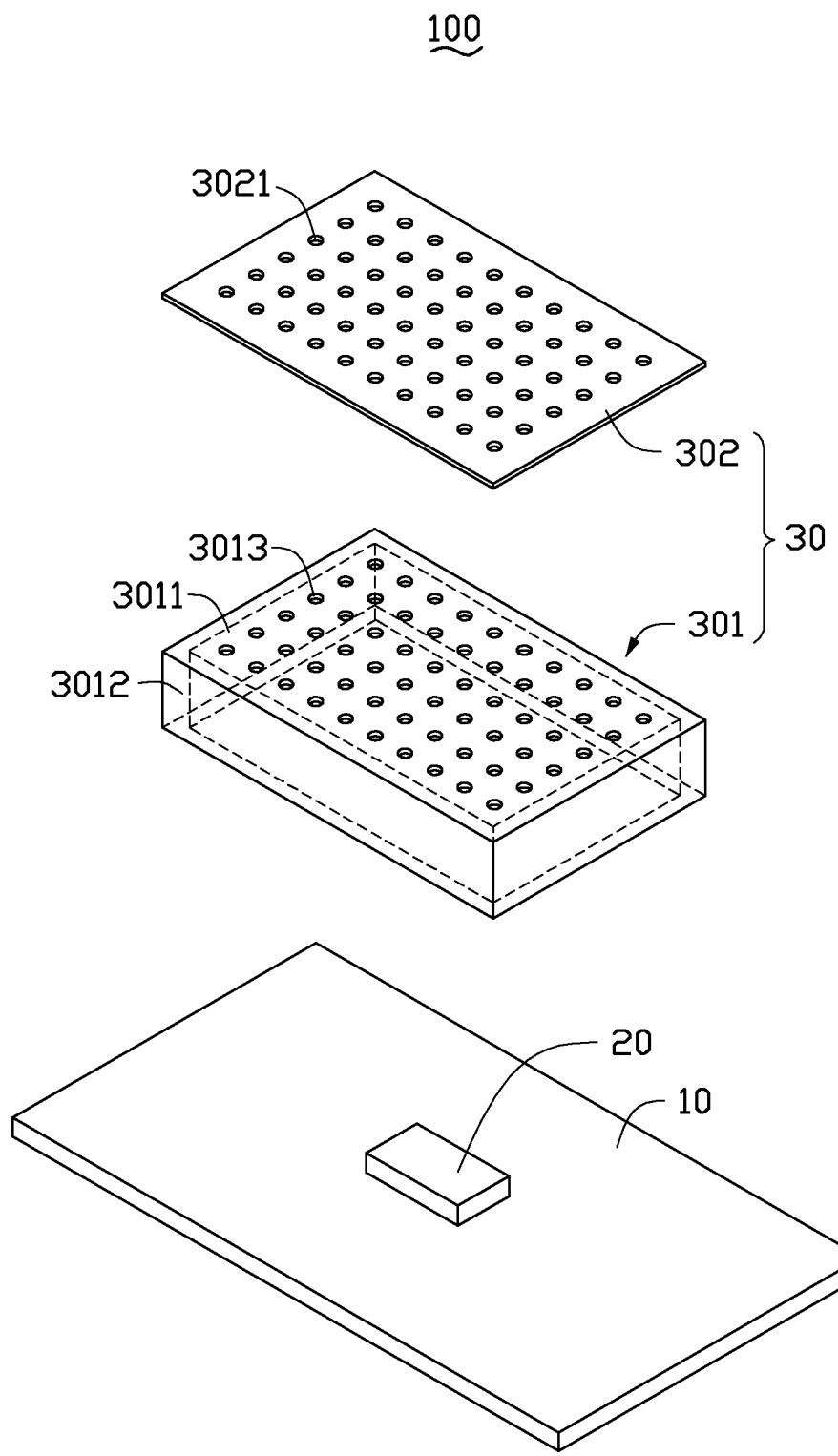
FIG. 1 is an exploded isometric view of an electronic device with an electromagnetic interference shield in accordance with an exemplary embodiment.

FIG. 1 shows an embodiment of the present disclosure of an electronic device 100. The electronic device 100 includes a main board 10, at least one electronic component 20 fixed on the main board 10, and an electromagnetic interference shield 30.

The electromagnetic interference shield 30 is arranged on the main board 10 and covers the at least one electronic component 20. The electromagnetic interference shield 30 includes a perforated shell body 301 and a magnetic material layer 302 formed on the shell body 301. In this embodiment, the shell body 301 is made of metal. The shell body 301 includes a top surface 3011 and four side walls 3012 perpendicularly connected to the top surface 3011. The top surface 3011 defines a number of holes 3013 for heat dispersing. In this embodiment, the holes 3013 are significantly smaller than the wavelength of electromagnetic waves blocked by the shield 30.

The magnetic material layer 302 formed on the top surface 3011 defines a number of through holes 3021 aligned with the holes 3013. The magnetic material layer 302 is used for heat dispersing and further is used to weaken the electromagnetic wave produced by the electronic component 20, to enhance the electromagnetic shielding. In a first embodiment, the magnetic material layer 302 is made of SmCo28. In a second embodiment, the magnetic material layer 302 may be made of NdFe35. In other embodiments, the magnetic material layer may be made of other magnetic materials as needed.

In an alternative embodiment, the holes 3013 may be defined in the side walls 3012, and the magnetic material layer 302 may be formed on the side walls 3012. In other embodiments, the holes 3013 may be defined both in the top surface 3011 and the side walls 3012, and the magnetic material layer 302 may be formed on both of the top surface 3011 and the side wall 3012. In this embodiment, the thickness of the top surface 3011 and the side walls 3012 are both 0.5 millimeters, and the thickness of the magnetic material layer 302 is 0.2 millimeters. In other embodiments, the thickness of the shell body 301 and the magnetic material layer 302 may be varied as needed.

Figure 2:
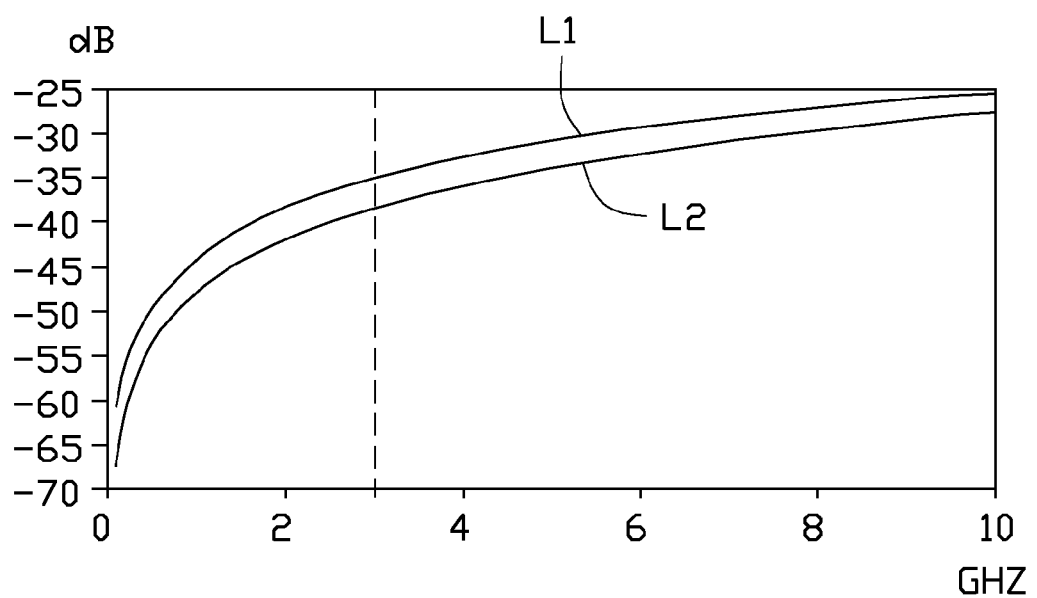
FIG. 2 is an electrical characteristics diagram shows the electrical characteristics of the electromagnetic interference shield with a SmCo28 layer having a thickness of 0.2 millimeters in a first embodiment and a conventional electromagnetic interface shield without the magnetic material layer.
Figure 3:
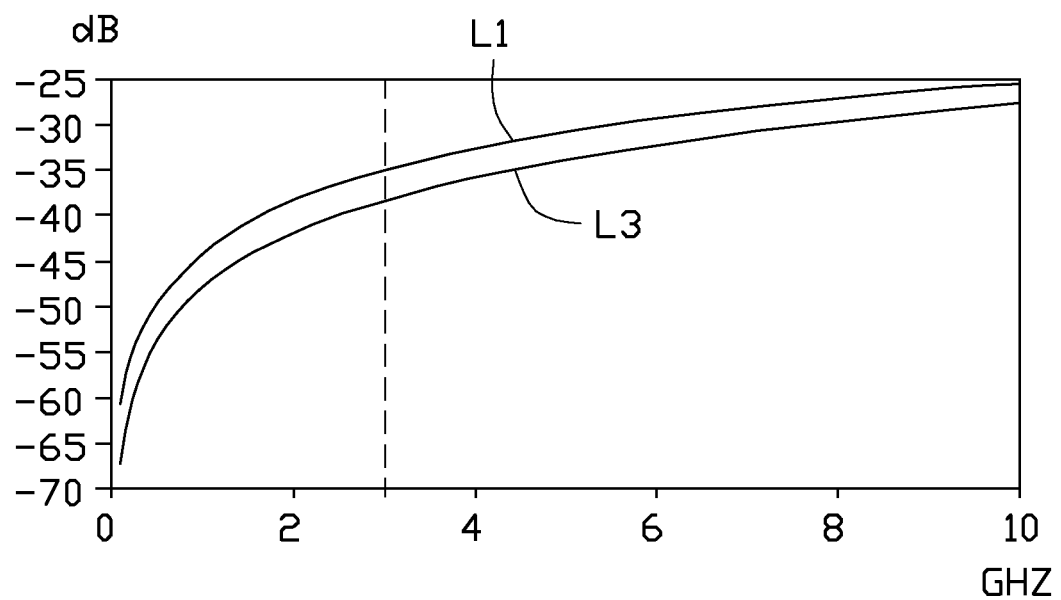
FIG. 3 is an electrical characteristics diagram shows the electrical characteristics of the electromagnetic interference shield with a NdFe35 layer having a thickness of 0.2 millimeters in the first embodiment and the conventional electromagnetic interference shield without the magnetic material layer.

FIG. 2 shows the electrical characteristics of the electromagnetic interference shield 30 with a SmCo28 layer having a thickness of 0.2 millimeters in the first embodiment and a conventional electromagnetic interference shield (not shown) without the magnetic material layer. FIG. 3 shows the electrical characteristics of the electromagnetic interference shield 30 with a NdFe35 layer having a thickness of 0.2 millimeters in the first embodiment and the conventional electromagnetic interference shield (not shown) without the magnetic material layer. The return losses of the conventional electromagnetic interference shield are shown in a first curve L1 in FIG. 2 and FIG. 3. A second curve L2 shows the return losses of the electromagnetic wave in the electromagnetic interference shield 30 with the SmCo28 layer in the first embodiment, and a third curve L3 shows the return loss of electromagnetic wave in the electromagnetic interference shield 30 with the NdFe35 layer in the second embodiment. As it is shown in the figures, when a frequency of the electromagnetic wave is 3 GHz, the return loss of the electromagnetic wave in the electromagnetic interference shield 30 in the first embodiment is −38.59 dB. The return loss of electromagnetic wave in the electromagnetic interference shield 30 in the second embodiment is −38.63 dB, and the return loss of electromagnetic wave in the conventional electromagnetic interference shield in the prior art is −37.2 dB. It is apparent that the shielding effect of the electromagnetic interference shield 30 of the present invention is enhanced by covering the magnetic material layer 302.

It is believed that the present embodiments and their advantages will be understood from the foregoing description, and it will be apparent that various changes may be made thereto without departing from the spirit and scope of the disclosure or sacrificing all of its material advantages, the examples hereinbefore described merely being exemplary embodiments of the present disclosure.

What is claimed is:

1. An electromagnetic interference shield comprising:
   a perforated shell body and a magnetic material layer formed on the shell body, a plurality of holes defined in the shell body, and a plurality of through holes defined in the magnetic material layer, the through holes aligned with the holes.

2. The electromagnetic interference shield as described in claim 1, wherein the magnetic material layer is comprised of SmCo28.

3. The electromagnetic interference shield as described in claim 1, wherein the magnetic material layer is comprised of NdFe35.

4. An electronic device comprising:
a main board;
an electronic component arranged on the main board; and
an electromagnetic interference shield arranged on the main board and covering the electronic component, the electromagnetic interference shield comprising a perforated shell body and a magnetic material layer formed on the shell body, a plurality of holes defined in the shell body, and a plurality of through holes defined in the magnetic material layer, the through holes aligned with the holes.

5. The electronic device as described in claim 4, wherein the magnetic material layer is comprised of SmCo28.

6. The electronic device as described in claim 4, wherein the magnetic material layer is comprised of NdFe35.

* * * * *